(12) United States Patent
Yamamoto et al.

(10) Patent No.: US 7,361,845 B2
(45) Date of Patent: Apr. 22, 2008

(54) WIRING LINE FOR HIGH FREQUENCY

(75) Inventors: Ryota Yamamoto, Kanagawa (JP); Masayuki Furumiya, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 814 days.

(21) Appl. No.: 10/352,301

(22) Filed: Jan. 27, 2003

(65) Prior Publication Data
US 2003/0141574 A1    Jul. 31, 2003

(30) Foreign Application Priority Data
Jan. 31, 2002    (JP) .............................. 2002-024315

(51) Int. Cl.
H05K 3/02    (2006.01)
H05K 3/10    (2006.01)
H05K 1/16    (2006.01)

(52) U.S. Cl. ..................... 174/260; 174/250; 174/261; 29/846

(58) Field of Classification Search ........ 174/250–261; 29/846, 847
See application file for complete search history.

(56) References Cited

U.S. PATENT DOCUMENTS

| | | | | |
|---|---|---|---|---|
| 4,498,535 A | * | 2/1985 | Bridges ....................... 166/248 |
| 5,002,367 A | * | 3/1991 | Nicholas ...................... 349/54 |
| 5,278,561 A | * | 1/1994 | Ohta ......................... 341/155 |
| 5,490,030 A | * | 2/1996 | Taylor et al. .................. 361/45 |
| 5,623,238 A | * | 4/1997 | Takahashi et al. ........... 333/204 |
| 5,717,556 A | * | 2/1998 | Yanagida .................... 361/803 |
| 6,396,713 B1 | * | 5/2002 | Iwanami ...................... 361/794 |
| 6,437,567 B1 | * | 8/2002 | Schenck et al. ............. 324/318 |
| 6,743,985 B1 | * | 6/2004 | Greim et al. ................ 174/261 |
| 2002/0189849 A1 | * | 12/2002 | Hirose et al. ................ 174/250 |

FOREIGN PATENT DOCUMENTS

| | | |
|---|---|---|
| JP | 61-20401 | 1/1986 |
| JP | 5-175357 | 7/1993 |
| JP | 05-80010 | 10/1993 |
| JP | 08-288463 | 11/1996 |
| JP | 09-082708 | 3/1997 |
| JP | 10-145017 | 5/1998 |
| JP | 10-200042 | 7/1998 |
| JP | 2000-232202 | 8/2000 |

OTHER PUBLICATIONS

Office Action dated Nov. 21, 2006 from Japanese Patent Office.
Translations of selected portions of Office Action dated Nov. 21, 2006 from Japanese Patent Office.
Office Action dated Apr. 17, 2007 from Japanese Patent Office.
Translations of selected portions of Office Action dated Apr. 17, 2007 from Japanese Patent Office.

* cited by examiner

Primary Examiner—Jeremy C Norris
(74) Attorney, Agent, or Firm—Darryl G. Walker

(57) ABSTRACT

Wiring lines for use at a high frequency having reduced resistance and/or inductance are disclosed that may be readily manufactured in a semiconductor integrated circuit. Wiring lines can include extension lines (2), connected to both ends of an inductor (1), that may each include divided wiring lines (2a and 2b) that are separated by a slit (3). A length, width and thickness of divided wiring lines (2a and 2b) can be essentially equal, resulting in divided wiring lines (2a and 2b) of essentially equal longitudinal resistance. A width of a slit (3) may preferably be greater than a width of each of divided wiring lines (2a and 2b).

19 Claims, 7 Drawing Sheets

WIRING LINE FOR HIGH FREQUENCY

TECHNICAL FIELD

The present invention relates generally to a wiring for carrying high frequency signals, and more particularly, to a wiring line for high frequency that may be used in a semiconductor integrated circuit that may provide reduced resistance and/or inductance.

BACKGROUND OF THE INVENTION

Generally, semiconductor integrated circuits that operate with a high frequency current can include high frequency passive circuit elements such as inductors, capacitors and resistors. Of such components, inductors are typically formed on an uppermost layer of a semiconductor integrated circuit in order to provide as much separation as possible between the inductors and other circuit elements. Because inductors are typically situated on an uppermost layer, relatively long extension lines are connected to both ends of the inductor in order to connect an inductor to a high frequency power source, or some other such circuit element.

Referring now to FIG. 5, a plan view shows an example of conventional extension lines for an inductor. As shown in FIG. 5, extension lines 6 can be connected to both ends of an inductor 1. One extension line 6 may be connected to a high frequency power source (not shown) by way of a through hole (not shown). The other extension line 6 can be connected to another circuit element (not shown), such as a capacitor or transistor, for example, by way of another through hole (not shown). In such an arrangement, a relatively high frequency current can be caused to flow through the two extension lines 6 and inductor 1.

A conventional approach, like that of FIG. 5, can have drawbacks, however. In recent years, a frequency at which current flows through integrated circuits has continued to increase. At such higher frequencies, a resistance presented by extension lines 6 may increase due to the "skin effect." Still further, a high frequency operating current can result in increased parasitic inductance in extension lines 6. The skin effect is a phenomenon in which when high frequency current flows through a conductor, a current flow can be concentrated at the vicinity of the conductor surface. As a result, very little current can flow through a center portion of a conductor, resulting in a decrease in effective conductor cross section, and hence an increase in resistance.

Increased parasitic inductance, due to high frequency current in extension lines 6, can add to the inductance of an inductor 1. Thus, a resulting inductance in a device can deviate from the designed inductance value presented by an inductor 1. Such undesirable deviations from an intended inductance value may lead to undesirable deviations in the frequency of a signal generated by an integrated circuit, and/or malfunctions in operation, in some cases. Because, as described above, extension lines may be relatively long when compared with other wiring lines of a semiconductor integrated circuit, such lines can present undesirably large resistance and inductance values when operating with a high frequency current.

In order to address the above problem, several conventional techniques have been proposed. In Japanese Patent Publication 08-288463 A (JP 08-288463 A), a technique is disclosed in which a width of a wiring line may vary in the direction of a wiring line thickness (i.e., irregularities are formed on sides of a wiring line). JP 08-288463 A indicates that such a technique can increase a surface area of a wiring line, and hence reduce increases in resistance resulting from the skin effect.

In addition, Japanese Patent Publication 09-082708 A (JP 09-082708 A) shows a technique in which a wiring line is formed that has a U-like cross sectional shape. This technique can make it possible to increase surface area, and thus, suppress an increase in resistance of a wiring line due to the skin effect.

Furthermore, Japanese Patent Publication 2000-232202 A (JP 2000-232202) discloses a technique for forming a two-layer wiring line for an inductor. JP 2000-232202 indicates that such a technique makes it possible to increase a surface area of a wiring line to thereby reduce a resistance of an inductor.

The above-mentioned conventional techniques may suffer from a number of drawbacks. In the case of making a thickness vary in the direction of a wiring line width, like that shown in JP 08-288463 A, a large number of process steps may be required to form such a complicated cross sectional shape. This can make manufacturing such wires more complicated and/or more costly. In addition, such an approach is not believed to reduce parasitic inductance.

In the case of making wiring lines with U-shaped cross sections, like that shown in JP 09-082708 A, a large number of process may also be required to form such a structure. Further, this technique is also not believed to reduce parasitic inductance of such wiring lines.

In the case of forming a two-layer wiring line for an inductor, like that shown in JP 2000-232202, such a technique may require a large number of process steps. In addition, while not described in JP 2000-232202, the present inventors and others have found that such a division in a wiring line for an inductor can lead to a reduction in an inductance of the inductor. Reasons why division in wiring lines can result in decreased inductance will be described in more detail below.

In light of the above, it would be desirable to address the above drawbacks to conventional approaches to providing wiring for high frequencies. Thus, it would be desirable to provide a wiring line for high frequency that has a relatively small resistance and/or low parasitic inductance when a high frequency current flows therethrough. It would also be desirable to provide a high frequency wiring line with such benefits that may be manufactured with fewer steps and/or more readily than conventional approaches.

SUMMARY OF THE INVENTION

The present invention may include a wiring line for a semiconductor integrated circuit for high frequency operation. Such a wiring line may include a single wiring line that includes a plurality of divided wiring lines disposed essentially parallel to one another. The single wiring line can receive a high frequency signal with a current that dividedly flows through the plurality of divided wiring lines.

According to one aspect of the embodiments, a high frequency signal current can be essentially equally divided among the divided wiring lines.

According to another aspect of the embodiments, divided wiring lines can each have lengths, widths, and thicknesses that essentially equal to one another.

According to another aspect of the embodiments, divided wiring lines can each have widths that may be essentially equal to one another, and a distance between wiring lines in the width direction can be no less than the width of the divided wiring lines.

According to another aspect of the embodiments, a single wiring line can be connected to an inductor.

According to another aspect of the embodiments, a single wiring line can have two ends, and divided wiring lines can merge into a contiguous line at both ends.

According to another aspect of the embodiments, divided wiring lines can be connected to a same wiring of a different layer with a through hole.

According to another aspect of the embodiments, a single wiring line can be connected to any of the elements from the group consisting of a high frequency power source, a transistor, and a capacitor.

According to another aspect of the embodiments, a number of divided wiring lines can be two.

According to another aspect of the embodiments, a number of divided wiring lines can be three.

The present invention may also include a high frequency wiring for a semiconductor integrated circuit that includes at least a first wiring for connecting a signal between two points that includes a plurality of divided wiring lines. The divided wiring lines can be essentially parallel to one another and separated from one another by at least one slit.

According to one aspect of the embodiments, an inductor can be connected to the at least first wiring, and can be formed from the same layer as the at least first wiring.

According to another aspect of the embodiments, the at least first wiring can include two extensions, each connected to different terminals of the inductor. Each extension can include a plurality of divided wiring lines.

According to another aspect of the embodiments a first wiring can be formed from an uppermost conductive layer of a semiconductor integrated circuit.

According to another aspect of the embodiments, each divided wiring line can have an essentially same width. A slit between such divided can have a slit width that is no less than the width of the divided wiring lines.

According to another aspect of the embodiments, each divided wiring line can have a same width, length, and thickness, and can be formed from the same material.

The present invention may also include a method of reducing a high frequency resistance and parasitic inductance of a wiring line between two points on a semiconductor integrated circuit. The method may include dividing at least a portion of the wiring line into a plurality of essentially parallel divided wiring lines separated from one another by at least one slit. Within the at least one slit, at least a portion of a parasitic inductance of one divided wiring line can cancel at least a portion of a parasitic inductance of an adjacent divided wiring line.

According to one aspect of the embodiments, dividing at least a portion of the wiring line can include forming divided wiring lines having essentially equal lengths, widths, and thicknesses, and forming the least one slit to have a dimension in the width direction that is greater than the width of the divided wiring lines.

According to another aspect of the embodiments, a number of divided wiring lines can be selected from the group consisting of two and three.

According to another aspect of the embodiments, a method may further include merging the plurality of divided wiring lines at one end of the wiring line.

BRIEF DESCRIPTION OF THE DRAWINGS

FIG. 2($b$) is a plan view showing the occurrence of a parasitic inductance for an embodiment according to the present invention.

FIG. 4($a$) corresponds to a conventional wiring line. FIGS. 4($b$) and 4($c$) correspond to very particular examples according to embodiments of the present invention.

DETAILED DESCRIPTION OF THE EMBODIMENTS

Various embodiments of the present invention will now be described in detail with reference to a number of drawings.

Figure 1:
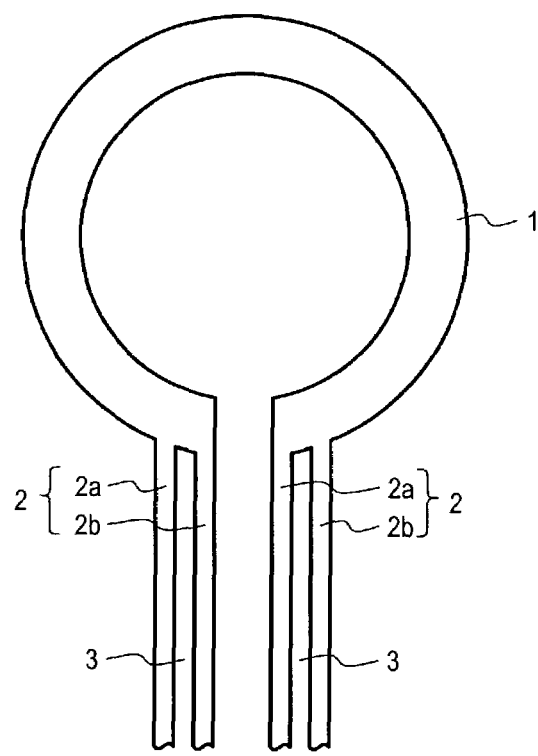
FIG. 1 is a plan view of a first embodiment of the present invention.

FIG. 1 is a plan view showing a first embodiment of the present invention. A first embodiment shows an example of a wiring line for high frequency utilized as extension lines for an inductor. As shown in FIG. 1, extension lines 2 can be connected to both ends of an inductor 1. In each extension line 2, two divided wiring lines 2a and 2b can be provided substantially in parallel with one another. Thus, each extension line 2 may include a slit 3 between divided wiring lines 2a and 2b. In addition, divided wiring lines 2a and 2b for each extension line 2 can be connected to an inductor 1. Opposite ends of extension lines 2 (i.e., the ends not connected to an inductor 1) can be connected to a same wiring by way of through holes, or the like (not shown). In addition or alternatively, a patterning process that produces extension lines 2 may merge divided wiring lines 2a and 2b, thus an extension line may be connected to a wiring line by way of a single through hole. In summary, extension lines 2 can be provided between an inductor 1 and one or more through holes.

One skilled in the art would recognize that through holes may connect a wiring of one conductive layer to that of another conductive layer.

An inductor 1 and extension lines 2 may be provided on a top layer of a semiconductor integrated circuit. One extension line 2 can be connected to a high frequency power source (not shown) by way of one through hole, while another extension line 2 may be connected to another circuit element (not shown), such as a capacitor or transistor, for example, by way of another through hole (not shown).

A length, width and thickness of a divided wiring line 2a can be essentially equal to that of a corresponding divided wiring line 2b. In addition, divided wiring lines 2a and 2b can be made of a same material (e.g., aluminum). In such an arrangement, a longitudinal resistance value of divided wiring lines 2a and 2b can essentially equal to one another.

While a slit 3 between divided wiring lines 2a and 2b is not limited to any particular dimension, a width of a slit 3 may preferably be equal to or larger than a width of divided wiring lines 2a and 2b. That is, if a width of divided wiring lines 2a and 2b was set to 5 microns (μm), a width of a slit 3 is preferably equal to or greater than 5 μm. A length of divided wiring lines 2a and 2b can vary according to a layout of a semiconductor integrated circuit, but can be in the range of about 20 μm to 100 μm, for example.

Next, the operation of an extension line for an inductor according to a first embodiment will now be described. A high frequency current signal can be caused to flow through extension lines 2 and an inductor 1 in the operation of a semiconductor integrated circuit. As noted above, each extension line 2 as shown in FIG. 1 can include divided wiring lines 2a and 2b. Further, when divided wiring lines 2a and 2b have an essentially same longitudinal resistance, a high frequency signal current can be equally divided between divided wiring lines 2a and 2b.

Figure 5:
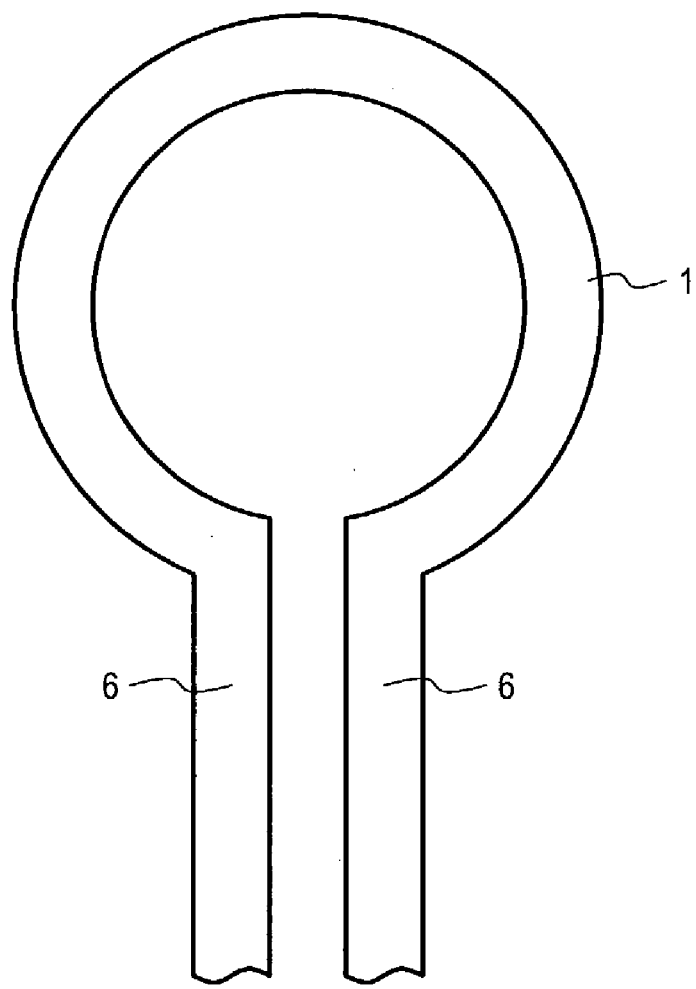
FIG. 5 is a plan view of conventional extension lines for an inductor.

It is also noted that because an extension line 2 can be divided into divided wiring lines 2a and 2b, a resulting surface for an extension line 2 may be greater than a conventional extension line 6 shown in FIG. 5. Because the flow of a current for a high frequency signal can be concentrated on a surface layer portion of extension lines, due to the skin effect, an increase in surface area can increase an overall effective cross section for a high frequency current. Thus, a resistance of an extension line 2 can be smaller than that of conventional extension line 6 with respect to a high frequency current.

Figure 2:
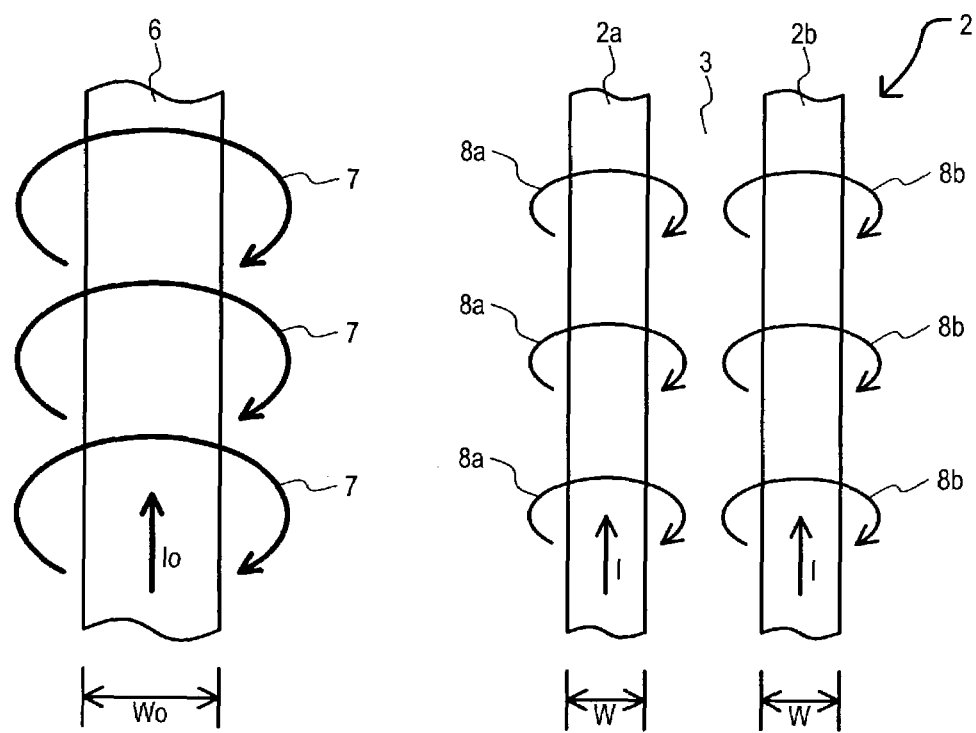
FIG. 2($a$) is a plan view showing the occurrence of a parasitic inductance for a conventional extension line.

FIGS. 2(a) and 2(b) are plan views showing the behavior of parasitic inductance for extension lines for an inductor. FIG. 2(a) shows a parasitic inductance for a conventional extension line, while FIG. 2(b) shows a parasitic inductance for an extension line according to one embodiment. As shown in FIG. 2(a), a high frequency current Io can flow through an extension line 6. Such a current flow can give rise to magnetic flux flows that strengthen one another to form relatively strong magnetic flux 7. That is, due to the arrangement of a conventional extension line 6, magnetic flux density can be increased. As a result, a relatively large parasitic inductance can be generated.

In contrast, according the present invention, an extension line may be divided into divided wiring lines 2a and 2b. A total width of divided wiring lines 2a and 2b can be equal to the width of a conventional extension line 6. Thus, a magnitude of the total current that flows through divided wiring lines 2a and 2b can be essentially equal to that which flows through conventional extension line 6. That is, referring to FIGS. 2(a) and 2(b), if a width of conventional extension line 6 is Wo, a magnitude of the current flowing through extension line can be Io. If a width of each of divided wiring lines 2a and 2b is W, and a current flowing through each divided wiring lines is I, then the following relationships can exist: Wo=W+W and Io=I+I.

Referring to FIG. 2(b), if a current I is caused to flow through each of divided wiring lines 2a and 2b, magnetic flux 8a and 8b can be generated around divided wiring lines 2a and 2b, respectively. Each of magnetic flux 8a and 8b can be essentially one half of magnetic flux 7 generated in the conventional case of FIG. 2(a).

However, because divided wiring lines 2a and 2b are separated by a slit 3, the degree to which magnetic fluxes 8a and 8b can strengthen one another can be low as compared to a magnetic flux 7 generated for a conventional extension line 6. Still further, within a slit 3, a direction of magnetic flux 8a can be essentially opposite to that of magnetic flux 8b. Such an arrangement can allow magnetic fluxes 8a and 8b to essentially cancel one another, still further reducing the possibility that such magnetic fluxes may contribute to one another. Thus, by generating magnetic fluxes 8a and 8b as described above, an overall magnetic flux for an extension line 2 can be smaller than that of magnetic flux 7 generated around a conventional extension line 6. Consequently, a parasitic inductance for an extension line 2 can be less than that of conventional extension line 7.

It is noted that the larger the width of a slit 3, i.e., the greater a distance is between divided wiring lines 2a and 2b, the smaller a parasitic inductance for an extension line 2 can be. However, the larger the width of a slit 3, the greater the area that an extension line 2 can occupy. Of course, a resistance of an extension line 2 may not depend upon a width of a slit 3.

In this way, according to one embodiment of the present invention, each of extension lines 2 can include divided wiring lines 2a and 2b formed with a slit 3 therebetween. This can reduce a resistance and/or parasitic inductance for such extension lines 2. As a result, it can be possible to suppress the amount of parasitic inductance introduced by extension lines 2 connected to an inductor 1, thereby making an actual inductance closer to that of the inductor 1.

Thus, according to the described embodiment, it can be possible prevent a signal generated by an integrated circuit from deviating from a desired frequency. In addition or alternatively, it can be possible to prevent a malfunction of a device at high frequencies. Still further, because extension lines 2 may be formed with the same process steps as a conventional extension line 6 (with a different mask, for example), extension lines 2 according to the present invention may be readily formed in a semiconductor integrated circuit device.

Figure 3:
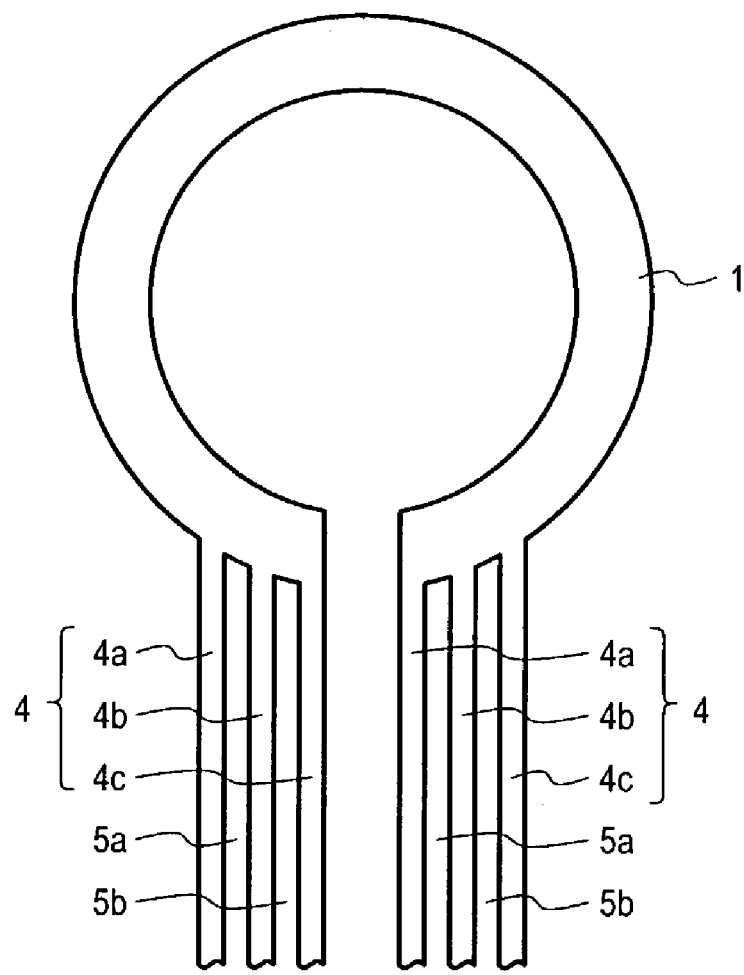
FIG. 3 is a plan view of a second embodiment of the present invention.

FIG. 3 is a plan view of a second embodiment of the present invention. A second embodiment, like the first embodiment of FIG. 1, shows an example of a wiring line for high frequency utilized as extension lines for an inductor. As shown in FIG. 3, extension lines 4 can be connected to both ends of an inductor 1 operating as a high frequency component.

Figure 6A:
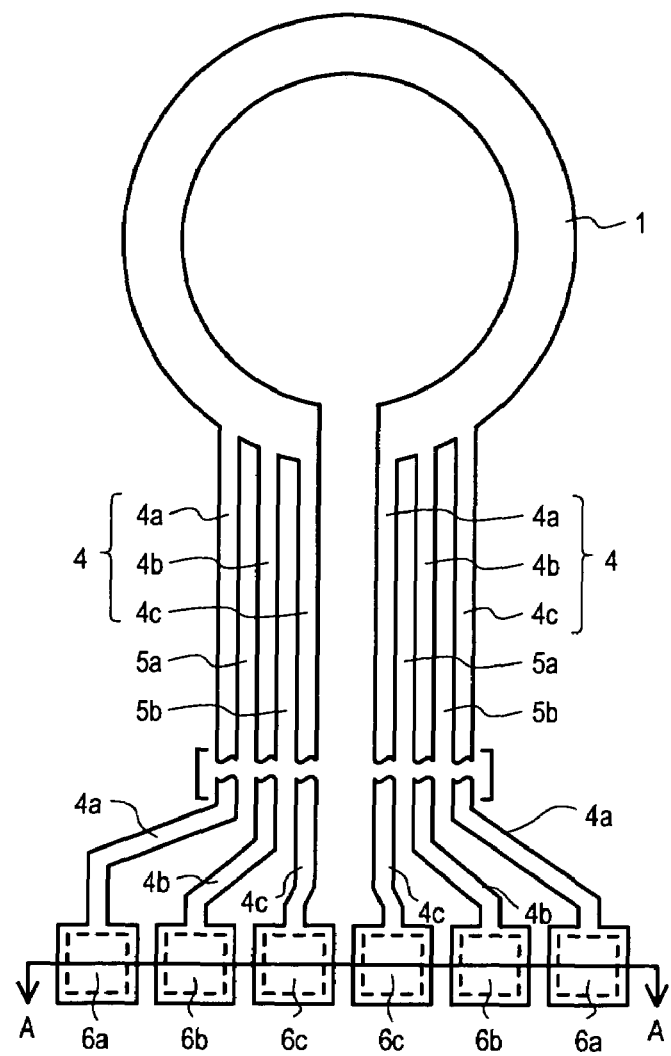
FIG. 6A is a plan view of an embodiment of the present invention.
Figure 6B:
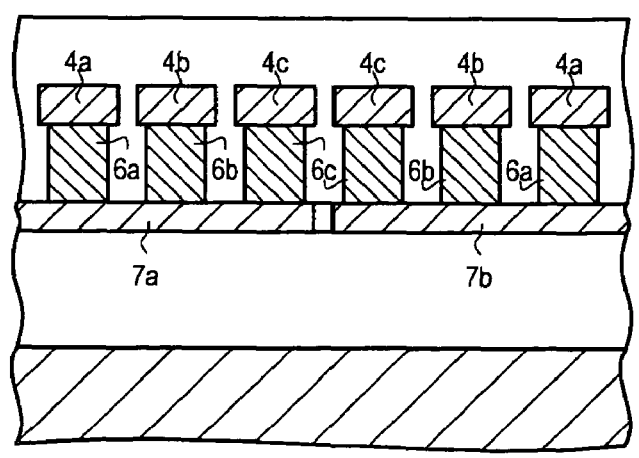
FIG. 6B is a cross sectional view taken along line A-A of FIG. 6A.
Figure 7A:
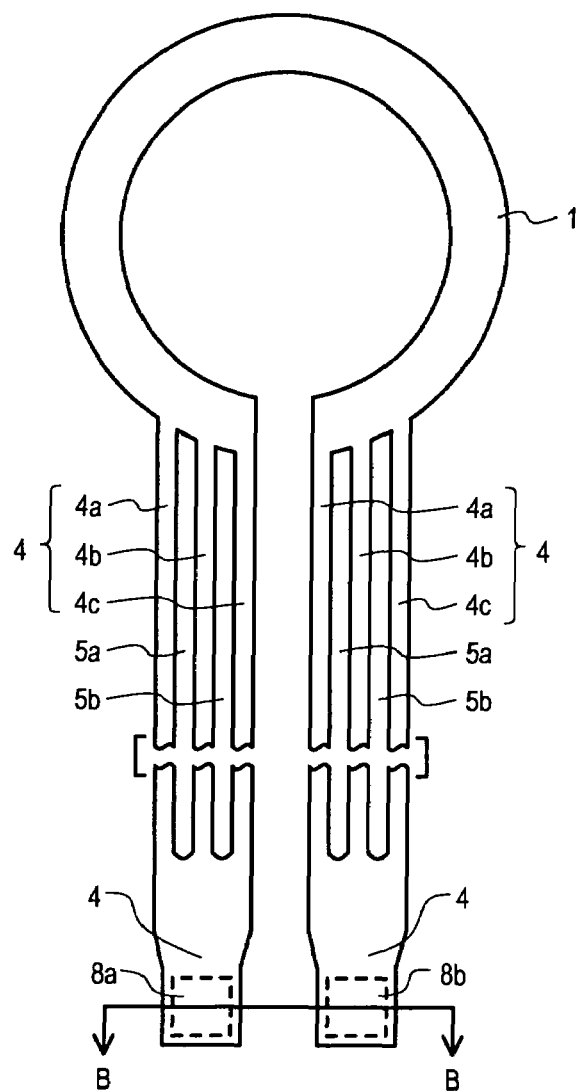
FIG. 7A is a plan view of an embodiment of the present invention.
Figure 7B:
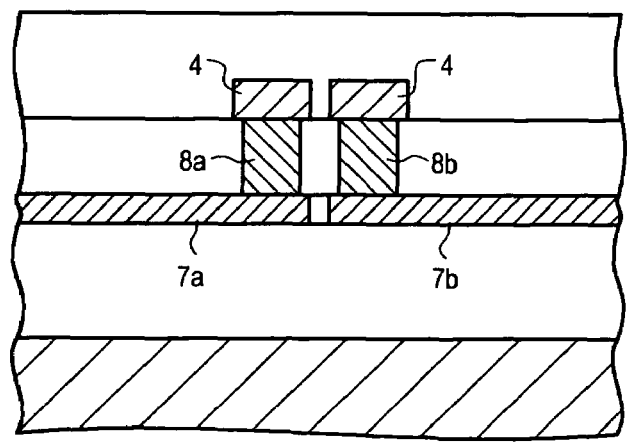
FIG. 7B is a cross sectional view taken along line B-B of FIG. 7A.

Referring now to FIG. 6A and FIG. 6B which is a cross sectional view taken along line A-A of FIG. 6A, each extension line 4 can include three divided wiring lines 4a, 4b, and 4c. Divided wiring lines 4a, 4b, and 4c can be arranged substantially in parallel with one another. Thus, each extension line 4 may include a slit 5a between divided wiring lines 4a and 4b, and a slit 5b between divided wiring lines 4b and 4c. In addition, divided wiring lines 4a, 4b, and 4c can be connected at one end to an inductor 1. Opposite ends of divided wiring lines 4a, 4b, and 4c (i.e., the ends not connected to an inductor 1) can be connected to a same wiring (7a, 7b) by way of through holes, or the like (6a, 6b, and 6c). In addition or alternatively, referring now to FIG. 7A and FIG. 7B, which is a cross sectional view taken along line B-B of FIG. 7A, a patterning process that produces extension lines 4 may merge divided wiring lines 4a, 4b, and 4c, thus an extension line 4 may be connected to another wiring line by way of a single through hole (8a, 8b).

Figure 8A:
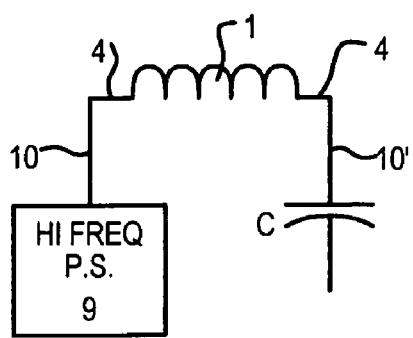
FIGS. 8A and 8B are circuit schematic diagrams of embodiments of the present invention.
Figure 8B:
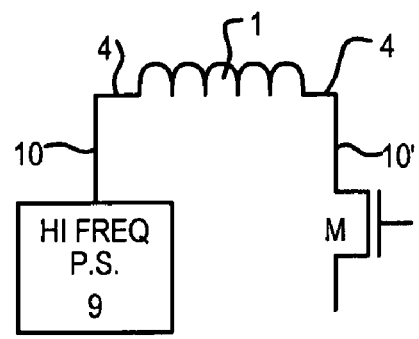

Referring to FIGS. 8A and 8B, similar to the first embodiment shown above, an inductor 1 and extension lines 4 may be provided on a top layer of a semiconductor integrated circuit. One extension line 4 can be connected to a high frequency power source 9 by way of a through hole 10, while another extension line 4 may be connected to another circuit element, such as a capacitor C or transistor M for example, by way of another through hole 10'. Then, in operation, a high frequency current may flow through extension lines 4 and inductor 1.

A length, width and thickness of each divided wiring lines 4a, 4b, and 4c can be essentially equal to one another. In addition, divided wiring lines 4a, 4b, and 4c can be formed of the same material. This may result in divided wiring lines 4a, 4b, and 4c that each have a longitudinal resistance value that is essentially equal.

As in the first embodiment, a width of a slit (5a or 5b) should not be necessarily limited to a particular dimension. However, slits (5a or 5b) can preferably have widths that are equal to or greater than the width of divided wiring lines 4a, 4b, and 4c.

The operation of an extension line according to a second embodiment can follow the same general principles of extension lines 2 according to the first embodiment. However, because extension lines 4 according to the second embodiment are divided into three divided wiring lines 4a, 4b, and 4c, a surface area for an extension line 4 can be greater than that of extension line 2. Consequently, a resistance (with respect to a high frequency signal) can be smaller for an extension line 4 than that of an extension line 2.

In addition, because a second embodiment can divide an extension line 4 into three divided wiring lines 4a, 4b, and 4c, magnetic flux generated by such divided wiring lines may be suppressed in a greater fashion than in the case of a first embodiment. Thus, a parasitic inductance of an extension line 4 according to a second embodiment can be smaller than that of an extension line 2 according to a first embodiment.

It is noted that an extension line 2 according to a first embodiment may advantageously occupy less area than an extension line 4 according to a second embodiment. However, as in the case of a first embodiment, an extension line 4 according to a second embodiment can be formed with the same process steps as a conventional extension line 6 (with a different mask, for example), and thus may be formed in a semiconductor integrated circuit device with relative ease.

While the above first and second embodiments have shown examples in which a high frequency wiring according to the present invention may be advantageously used as extension lines for an inductor, the present invention should not be limited to such an arrangement. For example, a high frequency wiring line according to the present invention may be used as an extension for circuit components other than an inductor. As but one example, a high frequency wiring according to the present invention may be an extension line for a variable capacitor, or the like. In addition, a high frequency wiring line according to the present invention may connect an extension line from a high frequency component to another portion of a device, such as another high frequency component, an input terminal, or an output terminal, as but a few examples. A high frequency wiring of the present invention may be particularly suitable for wiring lines of long length, or that might otherwise have a relatively high resistance and/or parasitic inductance if manufactured according to conventional approaches.

The advantageous effects of a wiring according to the present invention will now be described with reference to particular examples. Of course such particular examples are illustrative, and should not be construed as limiting the invention thereto. The inventors carried out simulations to compare a conventional wiring to that of an embodiment that includes dividing a wiring line into two divided wiring lines. The simulation examined the extent to which a width of a slit between divided wiring lines affects a resulting resistance and inductance at a high operating frequency.

Figure 4:
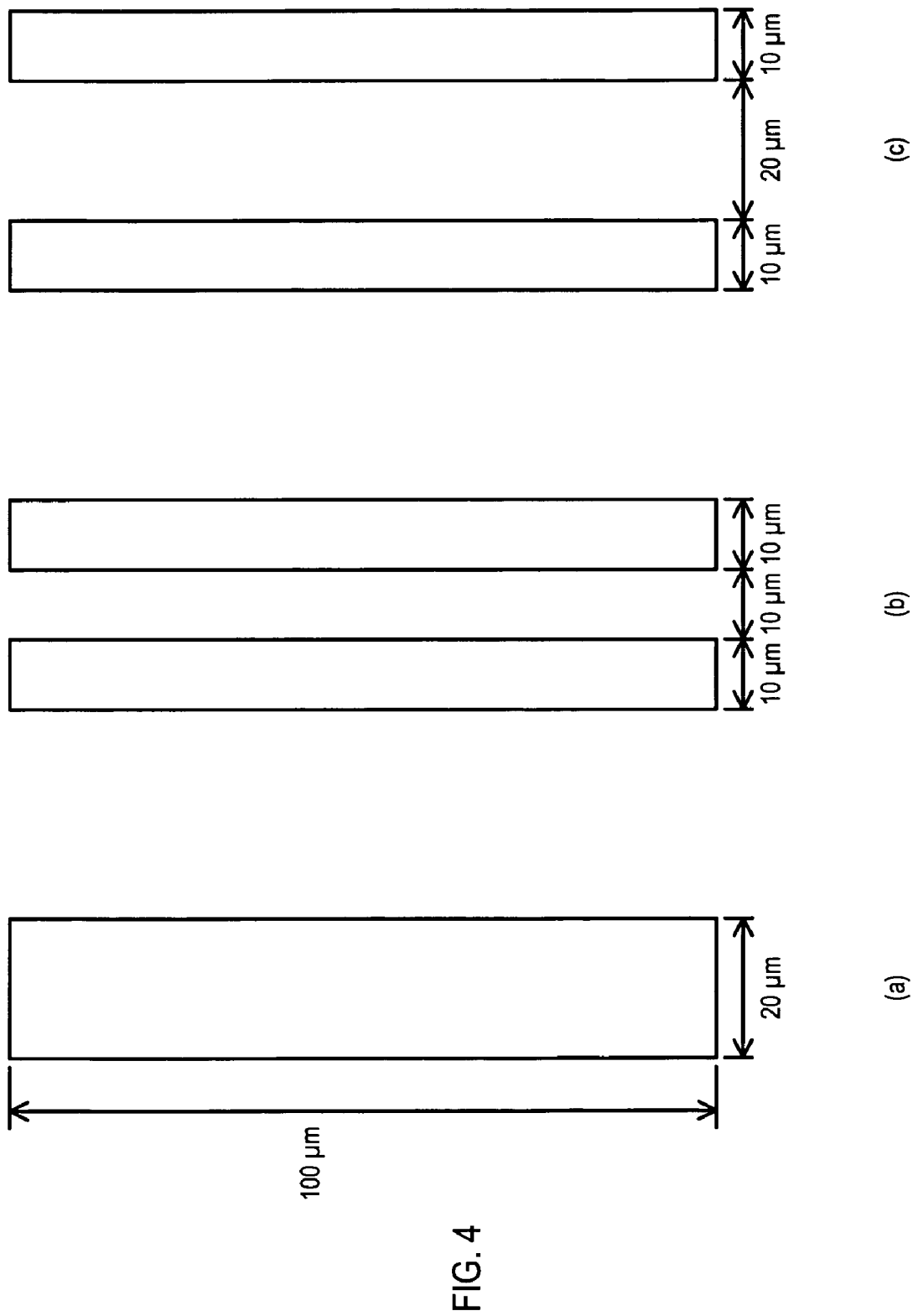
FIGS. 4($a$) to 4($c$) show structures for which a resistance and inductance were determined by simulation.

FIGS. 4(a) to 4(c) are plan views showing shapes of wiring lines subject to the simulation. FIG. 4(a) shows a wiring line for high frequency having no slit (e.g., a conventional wiring line). FIG. 4(b) shows a wiring line for high frequency having a slit with a width of 10 µm. FIG. 4(c) shows a wiring line for high frequency having a slit with a width of 20 µm. Each of the wiring lines was assumed to be formed from aluminum, have a length of 100 µm, overall width of 20 µm, and a thickness of 0.9 µm. In addition, the high frequency for the simulation was 10 gigahertz (GHz).

Results were generated with an electromagnetic field simulator, made by Sonnet® Software, Inc., of Liverpool, N.Y., USA. Results of the simulation are presented in Table 1, below.

TABLE 1

|  | No. | Width of Slit (µm) | Resistance (Ω) | Resistance (relative value) | Inductance (nH) | Inductance (relative value) |
| --- | --- | --- | --- | --- | --- | --- |
| Comparative Example | 1 | 0 | 0.420 | — | 0.110 | — |
| Example | 2 | 10 | 0.387 | Reduction by 8% | 0.092 | Reduction by 16% |
| Example | 3 | 20 | 0.378 | Reduction by 10% | 0.087 | Reduction by 21% |

In Table 1, "Comparative Example No. 1" can correspond to the structure of FIG. 4(a), "Example No. 2" can correspond to the structure of FIG. 4(b), and "Example No. 3" can correspond to the structure of FIG. 4(c). As can be ascertained from Table 1, a wiring formed by dividing a wiring into two divided wiring lines can result in resistance and inductance values that are lower than the conventional Example No. 1. That is, Comparative Example No. 1, which has no slit, can present a resistance of 0.420 Ω and an inductance of 0.110 nH. In contrast, Example No. 2, which can represent one very particular example of a first embodiment, can present a resistance of 0.387 Ω and an inductance of 0.092 nH, and thus produce an 8% reduction in resistance and a 16% reduction in inductance, as compared to Comparative Example No. 1. Further, Example No. 3, which can represent another very particular example of a first embodiment, can present a resistance of 0.378 Ω and an inductance of 0.087 nH, and thus produce a 10% reduction in resistance and a 21% reduction in inductance, as compared to Comparative Example No. 1.

The results of Table 1 also show that a resistance and inductance of Example No. 3 were lower than that of Example No. 2. As will be recalled, Example No. 3 represented a greater slit width than Example No. 2. Thus, the above results show how reductions in resistance and inductance can increase as a slit width between divided wiring lines is increased.

As has been illustrated above, according to embodiments of the present invention, it can be possible to obtain a wiring line for use with high frequencies that can present a large surface area, with respect to conventional approaches, and that can result in a lower resistance at such high frequencies. Further, according to the embodiments, a wiring line may be divided, presenting smaller current flows in multiple divided wiring lines. This can reduce overall parasitic inductance for such a wiring line. Furthermore, a wiring line according to the present invention may be readily manufactured as such lines may be formed with processes that can create divided wiring lines.

In this way, the performance of a semiconductor integrated circuit operating at high frequencies may be enhanced, and/or malfunctions may be prevented. For example, if a wiring line according to the present invention is utilized as extension lines for an inductor, a parasitic inductance introduced by such extension lines may be reduced. Thus, an inductance presented by such a structure may more closely follow that of the inductor, thereby facilitating the design of a semiconductor integrated circuit.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A wiring line for a semiconductor integrated circuit for high frequency operation, comprising:
   the semiconductor integrated circuit including a single wiring line that includes a plurality of divided wiring lines disposed essentially parallel to one another, the single wiring line receiving a high frequency signal with a current that dividedly flows through the plurality of divided wiring lines; wherein
   the single wiring line is connected to an inductor and the current is essentially equally divided among the divided wiring lines;
   the semiconductor integrated circuit further includes a second single wiring line that includes a plurality of divided second wiring lines disposed essentially parallel to one another, the second single wiring line receiving a high frequency signal with a current that dividedly flows through the plurality of divided wiring lines; wherein the second single wiring line is connected to said inductor and current is essentially equally divided among the divided second wiring lines; and
   the second single wiring line is provided in the same layer as the single wiring line.

2. The wiring line of claim 1, wherein:
   the divided wiring lines each have essentially equal lengths, widths, and thicknesses.

3. The wiring line of claim 1, wherein:
   the divided wiring lines each have widths that are essentially equal to one another, and a distance between wiring lines in the width direction is no less than the width of the divided wiring lines.

4. The wiring line of claim 1, wherein:
   the single wiring line has two ends, and the divided wiring lines merge into a contiguous line at both ends.

5. The wiring line of claim 1, wherein:
   the divided wiring lines are connected to a same wiring of a different layer than the single wiring with a through hole.

6. The wiring line of claim 1, wherein:
   the single wiring line is connected to any of the elements from the group consisting of: a high frequency power source, a transistor, and a capacitor.

7. The wiring line of claim 1, wherein:
   the number of divided wiring lines is two.

8. The wiring line of claim 1, wherein:
   the number of divided wiring lines is three.

9. A high frequency wiring for a semiconductor integrated circuit, comprising:
   the semiconductor integrated circuit includes
      at least a first wiring that connects a high frequency signal between two points that includes a plurality of divided wiring lines, essentially parallel to one another and separated from one another by at least one slit; and
      an inductor connected to the at least first wiring formed from the same layer as the at least first wiring.

10. The high frequency wiring of claim 9, wherein:
    the at least first wiring includes two extensions, each connected to different terminals of the inductor, each extension including the plurality of divided wiring lines.

11. The high frequency wiring of claim 9, wherein:
    the first wiring is formed from an uppermost conductive layer of the semiconductor integrated circuit.

12. The high frequency wiring of claim 9, wherein:
    each divided wiring line has essentially the same width, and the at least one slit has a slit width that is no less than the width of the divided wiring lines.

13. The high frequency wiring of claim 9, wherein:
    each divided wiring line has an essentially same width, length, and thickness, and is formed from the same material.

14. A method of reducing a high frequency parasitic inductance of a wiring line between two points on a semiconductor integrated circuit, comprising the steps of:
    dividing at least a portion of the wiring line on the semiconductor integrated circuit into a plurality of essentially parallel divided wiring lines separated from one another by at least one slit in which at least a portion of a high frequency parasitic inductance of one divided wiring line cancels at least a portion of a high frequency parasitic inductance of an adjacent divided wiring line.

15. The method of claim 14, wherein:
    dividing at least a portion of the wiring line includes forming divided wiring lines having essentially equal lengths, widths, and thicknesses, and forming the at least one slit to have a dimension in the width direction that is greater than the width of each of the divided wiring lines.

16. The method of claim 14, wherein:
    the number of divided wiring lines is selected from the group consisting of two and three.

17. The method of claim 14, further including:
    merging the plurality of divided wiring lines at one end of the wiring line.

18. The method of claim 14, wherein:
    the semiconductor integrated circuit further includes a second wiring line that connects a high frequency signal between two points that includes a plurality of divided second wiring lines, essentially parallel to one another and separated from one another by at least one slit;
    wherein the second wiring line is connected to an inductor and is provided in a same layer as the wiring line.

19. The method of claim 14, wherein:

the semiconductor integrated circuit further includes a second wiring line provided in a same layer as the wiring line; and the method further comprises dividing at least a portion of the second wiring line on the semiconductor integrated circuit into a plurality of essentially parallel divided second wiring lines separated from one another by at least one slit in which at least a portion of a high frequency parasitic inductance of one divided second wiring line cancels at least a portion of a high frequency parasitic inductance of an adjacent divided second wiring line.

* * * * *